United States Patent
Khelfa et al.

(10) Patent No.: US 11,601,769 B2
(45) Date of Patent: Mar. 7, 2023

(54) METHOD FOR TESTING AN AUDIO SIGNAL SYSTEM AND AIRCRAFT COMPRISING AN AUDIO SIGNAL SYSTEM

(71) Applicant: Airbus Operations GmbH, Hamburg (DE)

(72) Inventors: Frank Khelfa, Hamburg (DE); Johannes Passand, Hamburg (DE); Christian Dehnke, Buxtehude (DE); Matthias Heinisch, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 0 days.

(21) Appl. No.: 17/538,267

(22) Filed: Nov. 30, 2021

(65) Prior Publication Data
US 2022/0191634 A1 Jun. 16, 2022

(30) Foreign Application Priority Data
Dec. 16, 2020 (DE) .......................... 102020133867.8

(51) Int. Cl.
*H04R 29/00* (2006.01)
*G01R 31/11* (2006.01)
*G10L 25/51* (2013.01)

(52) U.S. Cl.
CPC ............. *H04R 29/00* (2013.01); *G01R 31/11* (2013.01); *G10L 25/51* (2013.01)

(58) Field of Classification Search
None
See application file for complete search history.

(56) References Cited

U.S. PATENT DOCUMENTS

| 7,120,256 B2 | 10/2006 | Grancea et al. |
| 10,965,816 B2 | 3/2021 | Heinisch et al. |

(Continued)

FOREIGN PATENT DOCUMENTS

| DE | 102007009574 B3 | 11/2008 |
| DE | 102013202921 A1 | 8/2013 |
| DE | 102018208073 B3 | 7/2019 |

OTHER PUBLICATIONS

German Search Report; priority document.
Analage 102020133867.8.pdf.

*Primary Examiner* — Paul W Huber
(74) *Attorney, Agent, or Firm* — Greer, Burns & Crain, Ltd.

(57) ABSTRACT

A method for testing an audio signal system having multiple audio component connection sockets, each socket having at least one audio signal interface connected to a ground interface of the socket via a series circuit including a resistor and a capacitor, including feeding, via a signal processing device, a time domain reflectometry test signal into a wired network of the audio signal system, in which the sockets are connected to the signal processing device via differently lengthed electrical lines, detecting in a temporally resolved manner, via the signal processing device, test return signals reflected at the multiple sockets, comparing the detected test return signals with a temporally resolved reference pattern for test return signals, which reference pattern was created under predefined boundary conditions, and determining a faulty connection of a socket if comparing the detected test return signals with the reference pattern reveals a deviation above a predefined threshold value.

17 Claims, 2 Drawing Sheets

(56) References Cited

U.S. PATENT DOCUMENTS

| | | | |
|---|---|---|---|
| 11,474,162 B2* | 10/2022 | Magno | G01R 19/15 |
| 2003/0235311 A1 | 12/2003 | Grancea et al. | |
| 2006/0186896 A1* | 8/2006 | Arnold | G01R 31/2841 |
| | | | 324/629 |
| 2009/0175195 A1 | 7/2009 | Macauley | |
| 2013/0221974 A1 | 8/2013 | Julson et al. | |
| 2015/0200498 A1 | 7/2015 | Underwood | |
| 2019/0364152 A1* | 11/2019 | Heinisch | H04R 3/00 |

* cited by examiner

METHOD FOR TESTING AN AUDIO SIGNAL SYSTEM AND AIRCRAFT COMPRISING AN AUDIO SIGNAL SYSTEM

CROSS-REFERENCES TO RELATED APPLICATIONS

This application claims the benefit of the German patent application No. 102020133867.8 filed on Dec. 16, 2020, the entire disclosures of which are incorporated herein by way of reference.

FIELD OF THE INVENTION

The present invention relates to a method for testing an audio signal system, in particular in an aircraft, and to an aircraft comprising an audio signal system.

BACKGROUND OF THE INVENTION

Modern aircraft typically have an audio communication system in order to enable communication between persons situated at different locations of the aircraft. By way of example, the cockpit crew are intended to be able to communicate from the cockpit with an engineer located in the exterior region of the aircraft, e.g., at the undercarriage or on a wing of the aircraft. For this purpose, a communication station in the interior of the aircraft is usually connected to connection sockets which are provided at a plurality of locations of the aircraft and which are configured for the connection of headsets.

In order to test the functionality of such an audio communication system, it is customary for a first person to operate the communication station, while a second person plugs a headset into each individual connection socket and attempts to establish communication with the first person. If this is not possible or is possible only to a limited extent, e.g., because the second person does not hear the first person, or vice versa, a functional fault of the respective connection socket of the audio communication system is deduced.

A partly automated method testing the output of audio output sockets provided on passenger seats of an aircraft is described in U.S. Pat. No. 7,120,256 B2. In accordance with this method, a standardized input signal is applied to the output sockets. A tester attaches a test apparatus to each individual output socket, the test apparatus being configured to determine the functionality of the respective socket on the basis of the signal tapped off at the output socket and the test input signal.

US 2015/0200498 A1 discloses an audio interface comprising a socket that receives a plug and transfers an audio signal to the plug, and comprising a detector in order to determine whether an audio signal is received at the socket, and optionally to generate a test signal indicating that an audio signal is received at the socket, at least when the plug is not connected to the socket.

US 2003/0235311 A1 discloses a method for improving the audio reproduction quality in a passenger environment with audio systems having headphone sockets. In this case, predefined audio tones are played over the audio system and a testing system is connected to the headphone sockets in order to monitor and check the quality of the signals received by the headphone socket.

DE 10 2007 009 574 B3 discloses a plug connector having a socket housing for providing a signal input of an audio apparatus, wherein a contact arrangement having a bridge contact is situated within the socket housing, the bridge contact being connected to a ground contact and two further signal contacts in order to prevent interference noise in the unplugged state.

DE 10 2018 208 073 B3 discloses a method for testing audio communication systems in which a test input signal is communicated from a test location to an audio output of the connection socket, the test input signal is forwarded to a microphone input of the connection socket by means of a test bridge circuit provided at the connection socket, and a test output signal coming from the microphone input of the connection socket is evaluated at the test location.

The concept of time domain reflectometry (TDR) is based on the injection of electromagnetic waves or test signals into a network of electrical lines and the subsequent detection and evaluation of reflection characteristics of the electromagnetic echoes returning from the network. In this case, a single pulse or a sequence of defined pulses of short duration, i.e., in very high frequency ranges, is generated, after the injection of which into the network the time of flight, frequency characteristic, polarity and/or echo amplitude of reflected pulse signals are/is measured in a temporally resolved manner. At locations in the network at which the characteristic impedance changes sufficiently, only one part of the pulse fed in is transmitted, while another part returns as an echo pulse. After all echo pulses have been detected, the injected pulse or the sequence of pulses can be compared with the reflection pattern. The information thereby obtained about the time of flight, frequency characteristic, polarity and/or echo amplitude permits conclusions to be drawn about the position and type of the locations of changing characteristic impedance in the network.

US 2009/0175195 A1 discloses methods for uniquely identifying communication lines in a network by means of TDR signatures, which involve receiving reflections of a pulsed signal from the communication lines in order to obtain a TDR signature for each communication line. Connection changes and/or communication line faults are identified by carrying out a comparison between TDR signatures obtained and previously stored TDR signatures.

SUMMARY OF THE INVENTION

One of the concepts of the present invention is to improve methods based on time domain reflectometry such that connection sockets of an audio signal system, in particular of an audio communication system in an aircraft, can be tested more simply and in a manner that saves more time.

In accordance with a first aspect of the invention, a method for testing an audio signal system having a multiplicity of connection sockets for audio components, each connection socket of which has at least one audio signal interface connected to a ground interface of the connection socket via a series circuit comprising a resistor and a capacitor, comprises the steps of feeding, by means of a signal processing device, a time domain reflectometry test signal into a wired network of the audio signal system, in which the connection sockets are connected to the signal processing device via electrical lines of different lengths, detecting in a temporally resolved manner, by means of the signal processing device, test return signals as time domain reflectometry test signals reflected at the multiplicity of connection sockets, comparing the detected temporally resolved test return signals with a temporally resolved reference pattern for test return signals, which reference pattern was created for the audio signal system under predefined boundary conditions, and determining a faulty connection of a connection socket to the wired network if the step of comparing the detected temporally resolved test return signals with the reference pattern reveals a deviation above a predefined threshold value.

In accordance with a second aspect of the invention, an audio signal system comprises a multiplicity of connection sockets for audio components, each connection socket of which has at least one audio signal interface connected to a ground interface of the connection socket via a series circuit comprising a resistor and a capacitor. The audio signal system furthermore comprises a signal processing device, which is connected to the multiplicity of connection sockets via electrical lines of different lengths in a wired network. In this case, the signal processing device is designed to feed a time domain reflectometry test signal into the wired network, to detect in a temporally resolved manner test return signals as time domain reflectometry test signals reflected at the multiplicity of connection sockets, and to determine faulty connections of one of the multiplicity of connection sockets to the wired network if the detected temporally resolved test return signals deviate from a temporally resolved reference pattern for test return signals, which reference pattern was created for the audio signal system under predefined boundary conditions, by more than a predefined threshold value.

One of the concepts of the invention is to communicate a time domain reflectometry test signal from a central test location, e.g. from a communication station situated in the cockpit of the aircraft, to audio outputs and/or microphone inputs of connection sockets installed at remote locations in the aircraft, and to compare a temporally resolved reflection pattern of test return signals from the connection sockets with a reference pattern in order to be able to check correct and intact cabling of the audio outputs and/or microphone inputs by determining deviations of the received reflection patterns from the reference pattern. In this way, a multiplicity of connection sockets can be tested from one and the same central location, without the need to go to the respective remote installation location of the connection sockets. This constitutes a considerable time saving. Particularly in the case of connection sockets that are difficult to access, e.g., on exterior structures of an aircraft, or those situated under covers, the time required for testing is shortened as a result. Furthermore, it becomes possible to detect connection mix-ups of cables connected correctly per se.

By virtue of the series circuits comprising resistor and capacitor, a fixed characteristic impedance can be assigned to each audio interface of the connection socket, without disturbing audio operation of the connection socket. This makes it possible to ascertain faulty connection conditions of cabling at the audio interfaces of the connection socket by means of time domain reflectometry, irrespective of whether or not an audio component is connected to the connection socket.

It is particularly advantageous that an influence of elements connected between the test location and the connection sockets on the reflection behavior of the test signal can be masked out by a suitable choice of the reference patterns in the evaluation. Precisely in cabling with a star topology and non-central test signal feeding-in—as is generally the case for connection sockets in aircraft—time domain reflectometry can constitute a simple test method in which it is not necessary to generate separate test signals by corresponding addressing of different connection sockets. The addressing is replaced as it were by the design of the cabling to the connection sockets since, as a result of the different line configurations toward the connection sockets, each of the connection sockets generates a corresponding reflection signature in the temporally resolved reflection pattern of all the components of the test return signal. As a result, it is not necessary to carry out the time domain reflectometry individually for each line and each connection socket, rather central feeding-in of test signals is possible, with which test signals all the connection sockets can be tested simultaneously and jointly. By way of a suitable dimensioning of passive circuit components of the socket termination circuits, a respective pairwise distinguishability between individual signatures can also additionally be amplified in order to further improve the precision of the time domain reflectometry evaluation.

In accordance with embodiments of the method and of the audio signal system, the resistance value of the resistor can be substantially of the same magnitude as the characteristic impedance of the electrical lines of the wired network of the audio signal system. This makes it possible to minimize the background signals of the reference pattern in the case of correctly installed connections.

In accordance with embodiments of the method and of the audio signal system, the capacitance of the capacitor can be chosen such that the cut-off frequency of the series circuit comprising the resistor and the capacitor lies above the highest frequency used for audio signals in the audio signal system. As a result, the series circuit becomes sensitive only for the high-frequency time domain reflectometry test signals and normal audio operation of the audio signal system is not adversely affected. In this case, it is advantageous if the time domain reflectometry test signal has a very short edge rise time and/or edge decay time, for example of less than 10 ns, in order to shift the test signals into a sufficiently high-frequency range.

In accordance with embodiments of the method and of the audio signal system, each of the multiplicity of connection sockets can have at least two audio signal interfaces connected to the ground interface of the connection socket in each case via a series circuit comprising a resistor and a capacitor. In this case, two possible audio signal interfaces can be, for example, an audio output for headphones and a microphone input. As an alternative thereto, stereo audio outputs can also be realized. In some of these embodiments, the resistance values of the resistors of the two series circuits of each of the multiplicity of connection sockets can be different. This can be helpful in order to be able to allocate interface-dedicated TDR signatures to each of the multiplicity of connection sockets.

In accordance with embodiments of the method and of the audio signal system, the wired network can have at least one signal splitter via which two or more of the multiplicity of connection sockets are connected to the signal processing device. Precisely in aircraft, such signal splitters are used principally for lightning protection purposes. By virtue of the time domain reflectometry method, the influences of such signal splitters that remain constant can be masked out by the use of reference patterns.

In aircraft, the electrical lines of the wired network can have lengths of between approximately 1 m and approximately 200 m. The method according to the invention is advantageous particularly in the case of audio communication systems comprising a multiplicity of connection sockets for headsets that are distributed in and on the aircraft. The signal processing device is suitable, in particular, for carrying out steps of the method of the first aspect of the invention and can be realized, for example, as a control unit, microcontroller or microprocessor having an associated data memory for storing reference patterns.

With the audio signal system, the method described above is able to be carried out in an aircraft. The advantages and features described for the method are thus analogously applicable to the aircraft as well. As already described on the basis of the method, the socket termination circuits with the series circuits afford the advantage, in particular, that it is possible to generate temporally resolved TDR signatures uniquely identifying return signals reflected at the socket termination circuits, via the respective connection sockets, by means of methods of time domain reflectometry (TDR). The temporally resolved TDR signatures make it possible to compare signature patterns in the return signals with reference patterns in order thus to be able to check the cabling of the connection sockets.

In accordance with a further embodiment, the aircraft has a multiplicity of connection sockets, wherein at least one connection socket is arranged on an exterior structure of the aircraft, for example on a wing, on the fuselage, in particular, in the region of a refueling flap or a space for accommodating an air-conditioning system, or in a space for accommodating an undercarriage. Connection sockets provided on exterior structures of the aircraft are usually covered by flaps or are situated in structures that are not straightforwardly accessible, in order that they are protected against environmental influences and damage. By virtue of the implementation of socket termination circuits on the connection sockets, checking the function of these connection sockets is significantly simplified since, for this purpose, actual physical access to the connection sockets is not required and TDR signatures can be obtained in a simple manner.

The connection sockets can also be arranged in an interior of the aircraft fuselage, in particular in the cargo hold or in the region of a rear pressure bulkhead.

BRIEF DESCRIPTION OF THE DRAWINGS

The invention is explained below with reference to the figures of the drawings. In the figures.

In the figures, the same reference signs designate identical or functionally identical components, unless indicated to the contrary.

DETAILED DESCRIPTION OF THE PREFERRED EMBODIMENTS

Figure 1:
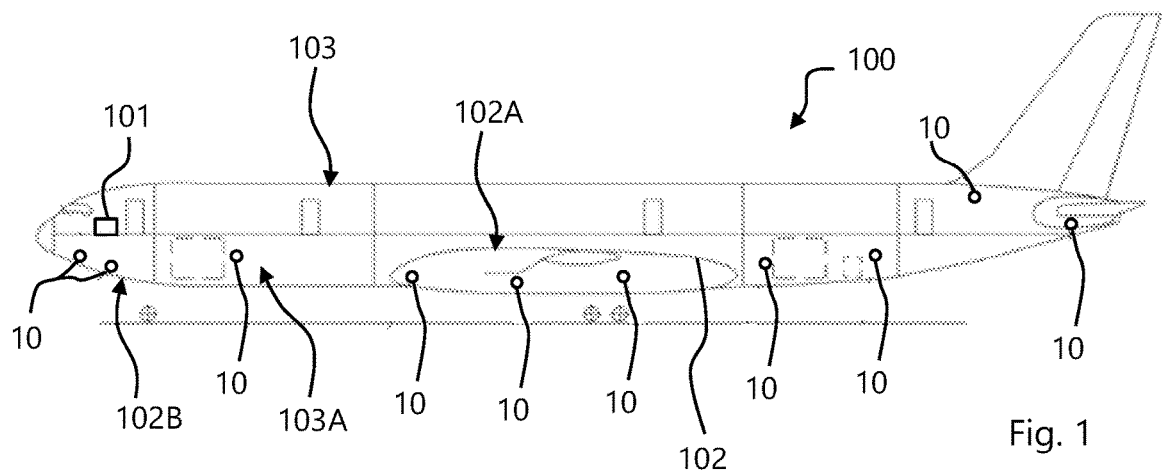
FIG. 1 shows a schematic view of an aircraft in accordance with one exemplary embodiment of the present invention.

FIG. 1 shows, by way of example, an aircraft 100 having an audio signal system 1 comprising a multiplicity of connection sockets 10 and a communication station 101. The audio signal system 1 can be, for example, an audio communication system for an aircraft 100. The communication station 101 can be arranged in the cockpit of the aircraft 100, for example, as is illustrated schematically in FIG. 1. The connection sockets 10 are distributed over the aircraft 100, wherein one or more connection sockets 10 can be provided, in particular, on an exterior structure 102 of the aircraft 100, e.g., in the region of a wing 102A or an undercarriage receptacle 102B. It goes without saying that connection sockets 10 can also be provided on an interior structure of the fuselage 103, e.g., in the region of a cargo compartment 103A.

Figure 2:
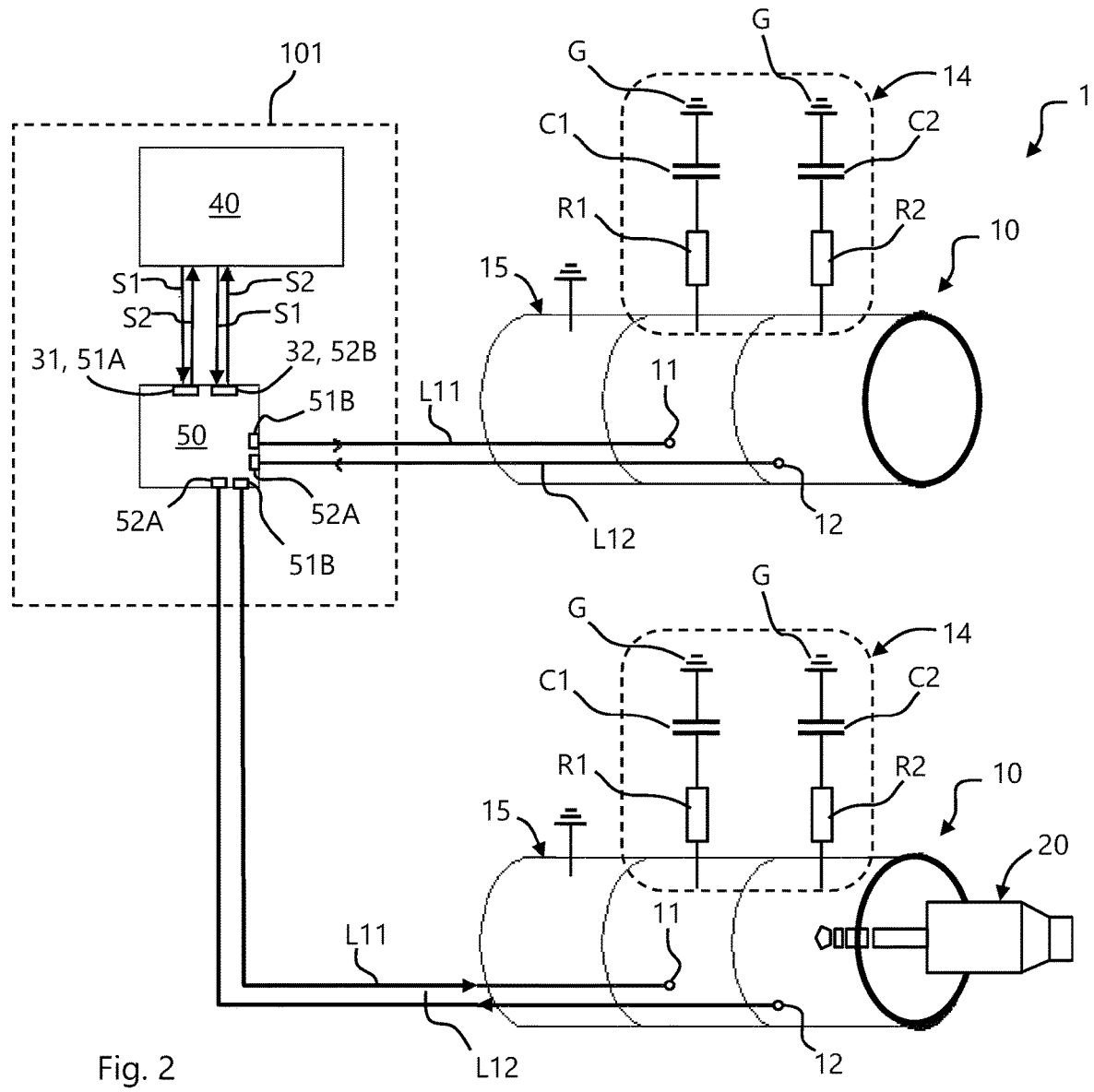
FIG. 2 shows a schematic, functional illustration of an audio communication system of an aircraft in accordance with a further exemplary embodiment of the present invention.

FIG. 2 shows a schematic, functional view of the audio signal system 1 of the aircraft 100. As shown in FIG. 2, the audio signal system 1 has at least one connection socket 10, a first audio interface 31 such as an audio input 31, for example, a second audio interface 32 such as a microphone output 32, for example, and a signal processing device 40. Optionally, at least one signal splitter 50 is additionally provided. The audio signal system 1 illustrated purely by way of example in FIG. 2 comprises two connection sockets 10 and one signal splitter 50. In this case, it should be clear that more than two connection sockets 10 can be implemented, and that a different number of connection sockets 10 can be connected to a respective signal splitter 50.

The audio signal system 1 can be, for example, an audio communication system for maintenance engineers, airport ground personnel and/or crew members of an aircraft who have to communicate among one another from various locations of the aircraft. In this case, for instance, a cockpit crew can be able to communicate from the cockpit with an engineer located, for example, at the undercarriage, on a wing or in the cargo hold of the aircraft. For this purpose, the audio signal system 1 can have connection sockets 10 configured for the connection of headsets 2. As an alternative thereto, it is also possible to configure the audio signal system 1 as a unidirectional audio system, for example, as part of an on-board entertainment system or an announcement system in a passenger cabin of an aircraft. In this case, the audio signal system 1 can have connection sockets 10 which are assigned to respective passenger seats and to which mono or stereo headphones 2 for receiving audio messages from the cockpit or a communication station for pursers are connectable. In aircraft, the connection sockets 10 are connected among one another and to a central communication station typically via electrical lines having a length of between 1 m and 100 m.

As shown in FIG. 2, the at least one connection socket 10 has a first audio interface 11, a second audio interface 12, a ground interface 15 and a socket termination circuit 14. The connection socket 10 can be embodied, in particular, as a cylindrical socket, into which a connection plug 20 of an audio component 2 such as a headset 2, for example, the connection plug being embodied in the manner of a jack plug, is insertable. FIG. 2 illustrates one of the connection sockets 10 in an unoccupied state, in which the connection socket 10 is free of a connection plug 20 or a connection plug 20 has not been inserted into the connection socket 10. The other of the connection sockets 10 shown in FIG. 2 is illustrated in an occupied state, in which a connection plug 20 has been inserted into the connection socket 10.

Figure 3:
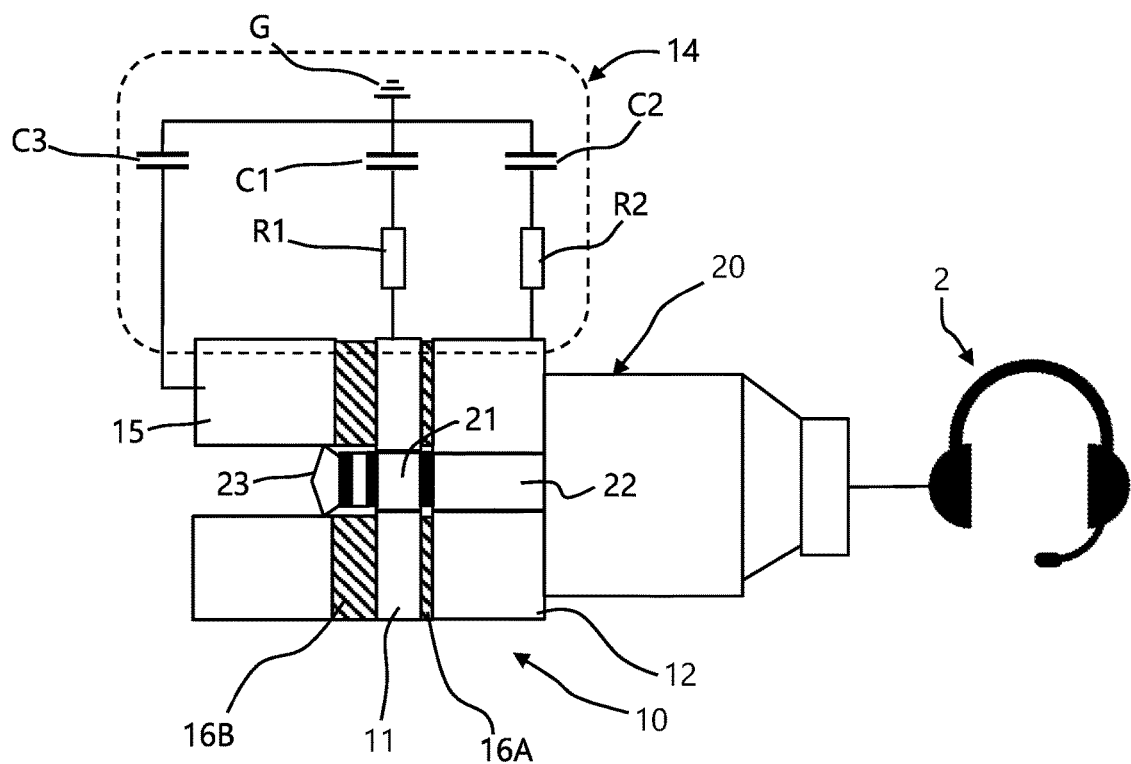
FIG. 3 shows a schematic detailed view of a connection socket of the audio communication system of an aircraft with an inserted connection plug in accordance with a further exemplary embodiment of the present invention.

FIG. 3 shows the connection socket 10 in an occupied state. As illustrated by way of example in FIGS. 2 and 3, the first audio interface 11 and the second audio interface 12 can be realized, in each case, as cylindrical, electrically conductive sleeve bodies, which are arranged coaxially and are spaced apart and electrically insulated from one another by an insulation ring 16A. The ground interface 15 can likewise have a cylindrical, electrically conductive sleeve body, which is arranged coaxially with respect to the sleeve bodies of the first audio interface 11 and of the second audio interface 12 and is spaced apart and electrically insulated from them by an insulation ring 16B. It should be clear here that besides the ground interface 15 any desired number of audio interfaces can be implemented on the connection socket.

In the occupied state of the connection socket 10 as illustrated by way of example in FIG. 3, a microphone output 22 of the connection plug 20 of a headset 2 is electrically connected to the second audio interface 12 of the connection socket 10, the second audio interface being configured as a microphone input, and an audio input 21 of the connection plug 20 of the headset 2 is electrically connected to the first audio interface 11 of the connection socket 10, the first audio interface being configured as an audio output.

FIGS. 2 and 3 illustrate, by way of example, a socket termination circuit 14 having two snubber circuits as series circuits each comprising a snubber resistor R1 and R2, respectively, and a snubber capacitor C1 and C2, respectively, which connect one of the audio interfaces 11 and 12 relative to ground. Such snubber circuits may also be referred to as Boucherot elements. In the case of average driver currents of approximately 100 mA present at the audio interfaces 11, 12 of the connection sockets 10, the value of the snubber resistors R1 and R2, respectively, can be approximately 100Ω. In this case, the capacitance of the snubber capacitors C1 and C2, respectively, can be between 1 pF and 100 nF in order to obtain RC times of the snubber circuits in a range in which the cut-off frequency of the snubber circuits is above 100 kHz. The resistance value of the snubber resistors can be chosen such that it substantially corresponds to the characteristic impedance of the electrical lines to the audio interfaces 11, 12. Together with a suitably chosen capacitance for the snubber capacitors C1 and C2, therefore, an RC time of the Boucherot elements can be set such that the cut-off frequency thereof is higher than the frequencies used for audio signals during normal audio operation of the audio signal system 1.

The socket termination circuits 14 can be identical for each of the connection sockets 10, that is to say, can have in each case identical resistance values for the snubber resistors R1 and R2, respectively, and identical capacitance values for the snubber capacitors C1 and C2, respectively. Through the use of standardized simple passive circuit components for each of the connection sockets 10, it is easier and cheaper to implement the audio signal system 1 and to adapt it to the ambient conditions such as, for instance, temperature and moisture operative ranges or vibration resistance. Furthermore, the connection sockets 10 are easier to repair or exchange in the case of damage, since there is merely a standardized component therefor.

The audio input 31 and the microphone output 32 are preferably provided at the communication station 101 of the aircraft 100 and generally at the same location within the aircraft 100. As illustrated by way of example in FIG. 2, the audio input 31 can be formed by a first signal splitter input 51A of the optional signal splitter 50. In this case, a first signal splitter output 51B of the signal splitter 50, which is connected to the first signal splitter input 51A, is connected to the first audio interface 11 of the connection socket 10 via an electrical line L11 of a wired network. Optionally, the microphone output 32 can furthermore also be provided at the optional signal splitter 50, for example in the form of a second signal splitter output 52B. In this case, the second audio interface 12 of the connection socket 10 is connected to a second signal splitter input 52A of the signal splitter 50, which is connected to the second signal splitter output 52B.

Furthermore, in FIG. 2 by way of example, one signal splitter 50 is provided for all the connection sockets 10. It goes without saying that different subgroups of the connection sockets 10 can be assigned a dedicated signal splitter 50. The optional signal splitter 50 is illustrated by way of example in FIG. 2 as part of the communication station 101, but can also be realized separately from the latter.

A signal processing device 40 is illustrated by way of example in FIG. 2 likewise as part of the communication station 101, but can, of course, also be realized separately from the latter. Generally, the signal processing device 40 is connectable to the signal splitter 50, for example by means of electrical lines or cables as part of a wired network. The signal processing device 40 can have, in particular, a processor (not illustrated) and a nonvolatile data memory (not illustrated) connected thereto, on which is stored software configured to cause the processor to feed one or more test signals S1 into the wired network. In this case, the signal processing device 40 can carry out a time domain reflectometry method (TDR) that involves generating a TDR test signal S1, for example a single pulse (for instance rectangular pulses) or a plurality of pulses in a pulse sequence with edge rise times and edge decay times of less than 10 nanoseconds, which is fed into a wired network. The wired network can comprise, in particular, the lines from the signal processing device 40 to a number of signal splitters 50 and also electrical lines L11, L12 connecting the multiplicity of connection sockets 10 to the signal splitters 50. The TDR test signal S1 passes along the electrical lines L11, L12 and is partly reflected at locations of changing characteristic impedance.

The reflection characteristic differs in terms of time of flight, polarity, amplitude and frequency depending on different reflection conditions, such that temporally resolved signal patterns can be generated from test return signals S2 that return from the wired network. They also include time domain reflectometry test signals which are reflected at the multiplicity of connection sockets 10 and which make it possible to determine faulty connections of one or more of the multiplicity of connection sockets 10 to the wired network by way of the reflection characteristics. Faulty connections can comprise, for example, incorrectly connected audio interfaces, short circuits between audio interfaces, cable or line mix-ups between different audio interfaces or ground interfaces or inadequately connected lines at audio interfaces. The temporal reflection characteristics at the connection sockets 10 can, for example, principally be influenced by a line length of the respective electrical lines L11, L12 toward the respective audio interfaces 11 and 12. In this case, the time of flight delay of the reflected test signals becomes all the greater, the longer the line length of the associated audio interfaces 11 and 12, respectively.

The signal processing device 40 stores a temporally resolved reference pattern for test return signals S2, which reference pattern was created for the audio signal system 1 under predefined boundary conditions. By way of example, a checked functional audio signal system 1 in which other measures have been taken to ensure that no faulty connections whatsoever are present can be supplied with time domain reflectometry test signals S1 and the measured test return signals S2 can be used for creating the reference pattern. As an alternative or in addition thereto, it is also possible to obtain a reference pattern by way of the simulation of an audio signal system 1 under the predefined boundary conditions.

After detecting the test return signals S2, the signal processing device 40 determines whether the detected temporally resolved test return signals S2 deviate from the temporally resolved reference pattern by more than a predefined threshold value. If this is the case, it can be established that faulty connections are present. Moreover, by way of the temporal profile of the significant deviations vis-à-vis the reference pattern, specific connection sockets 10 in which the faulty connections have occurred can be deduced.

Figure 4:
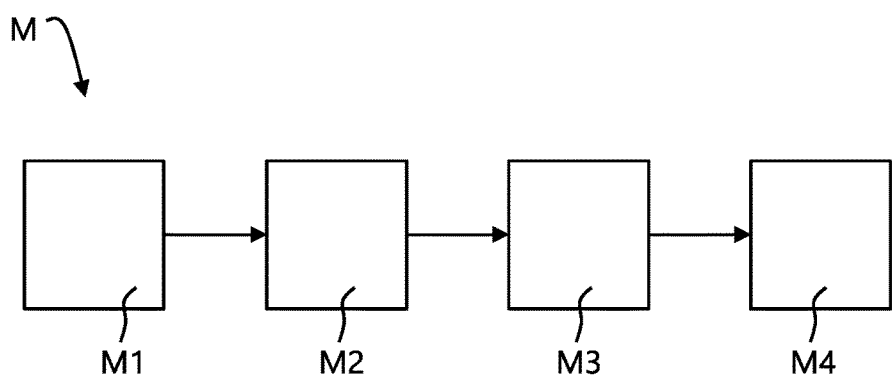
FIG. 4 shows an illustrative flow diagram of a method for testing an audio communication system of an aircraft in accordance with a further exemplary embodiment of the present invention.

A method M for testing the audio signal system of an aircraft is described below with reference to the flow diagram in FIG. 4. The method M will be able to be used, in particular, in an audio signal system 1 as illustrated and explained in association with FIGS. 1 to 3. In a first step Ml, a time domain reflectometry test signal S1 is fed into a wired network of the audio signal system 1 by means of a signal processing device 40. The time domain reflectometry test signal S1 passes to connection sockets 10 of the audio signal system 1 via electrical lines L11, L12 of different lengths. In a second step, test return signals S2 are detected in a temporally resolved manner. The test return signals S2 are time domain reflectometry test signals that are reflected at the connection sockets 10 with the socket termination circuits 14.

In a third step M3, the signal processing device 40 can compare these test return signals S2 detected in a temporally resolved manner with a correspondingly temporally resolved reference pattern. The reference pattern was created beforehand for the audio signal system 1 under predefined boundary conditions, for example by measurement of a system identified as free of faults or by numerical simulation. If the comparison from step M3 reveals a deviation of the detected temporally resolved test return signals S2 from the reference pattern, which deviation lies above a predefined threshold value regarded as significant, in a fourth step M4 the signal processing device 40 can determine that there is a faulty connection of a connection socket 10 to the wired network. By way of the temporal position of the deviation in the signal pattern defined by the test return signals S2, it is furthermore possible to determine at which of the connection sockets 10 the faulty connection is present.

Although the present invention has been explained by way of example above on the basis of exemplary embodiments, it is not restricted thereto, but rather is modifiable in diverse ways. In particular, combinations of the exemplary embodiments above are also conceivable.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS

1 Audio signal system
2 Audio components, e.g. headset
10 Connection socket
11 First audio signal interface of the connection socket
12 Second audio signal interface of the connection socket
14 Socket termination circuit
15 Ground interface
16A, 16B Insulation rings
20 Connection plug
21 First audio signal interface of the connection plug
22 Second audio signal interface of the connection plug
23 Ground contact of the connection plug
31 First audio signal port
32 Second audio signal port
40 Signal processing device
50 Signal splitter
51A First signal splitter input
51B First signal splitter input
52A Second signal splitter input
52B Second signal splitter input
100 Aircraft
101 Communication station
102 Exterior structure
102A Wing
102B Undercarriage receptacle
103 Fuselage
C1 First snubber capacitor
C2 Second snubber capacitor
C3 Compensation capacitor
R1 First snubber resistor
R2 Second snubber resistor
G Ground
S1 Time domain reflectometry test signal
S2 Test return signal

The invention claimed is:

1. A method for testing an audio signal system having a multiplicity of connection sockets for audio components, each connection socket having at least one audio signal interface connected to a ground interface of the connection socket via a series circuit comprising a resistor and a capacitor, the method having the following steps:
feeding, by means of a signal processing device, a time domain reflectometry test signal into a wired network of the audio signal system, in which the connection sockets are connected to the signal processing device via electrical lines of different lengths;
detecting in a temporally resolved manner, by means of the signal processing device, test return signals as time domain reflectometry test signals reflected at the multiplicity of connection sockets;
comparing the detected temporally resolved test return signals with a temporally resolved reference pattern for test return signals, which reference pattern was created for the audio signal system under predefined boundary conditions; and
determining a faulty connection of a connection socket to the wired network if the step of comparing the detected temporally resolved test return signals with the reference pattern reveals a deviation above a predefined threshold value.

2. The method as claimed in claim 1, wherein a resistance value of the resistor is substantially of the same magnitude as a characteristic impedance of the electrical lines of the wired network of the audio signal system.

3. The method as claimed in claim 2, wherein a capacitance of the capacitor is chosen such that the cut-off frequency of the series circuit comprising the resistor and the capacitor lies above the highest frequency used for audio signals in the audio signal system.

4. The method as claimed in claim 1, wherein a time domain reflectometry test signal has at least one of an edge rise time or edge decay time of less than 10 ns.

5. The method as claimed in claim 1, wherein each of the multiplicity of connection sockets has at least two audio signal interfaces connected to the ground interface of the connection socket in each case via a series circuit comprising a resistor and a capacitor.

6. The method as claimed in claim 5, wherein the resistance values of the resistors of the two series circuits of each of the multiplicity of connection sockets are different.

7. The method as claimed in claim 1, wherein the wired network has at least one signal splitter via which two or more of the multiplicity of connection sockets are connected to the signal processing device.

8. An audio signal system, comprising:
a multiplicity of connection sockets for audio components, each connection socket having at least one audio signal interface connected to a ground interface of the connection socket via a series circuit comprising a resistor and a capacitor; and
a signal processing device, which is connected to the multiplicity of connection sockets via electrical lines of different lengths in a wired network and which is configured to feed a time domain reflectometry test signal into the wired network, to detect in a temporally resolved manner test return signals as time domain reflectometry test signals reflected at the multiplicity of connection sockets, and to determine faulty connections of one of the multiplicity of connection sockets to the wired network if the detected temporally resolved test return signals deviate from a temporally resolved reference pattern for test return signals, which reference pattern was created for the audio signal system under predefined boundary conditions, by more than a predefined threshold value.

9. The audio signal system as claimed in claim 8, wherein a resistance value of the resistor is substantially of the same magnitude as a characteristic impedance of the electrical lines of the wired network.

10. The audio signal system as claimed in claim 9, wherein the capacitance of the capacitor is chosen such that the cut-off frequency of the series circuit comprising the resistor and the capacitor lies above the highest frequency used for audio signals in the audio signal system.

11. The audio signal system as claimed in claim 8, wherein the signal processing device is designed to generate the time domain reflectometry test signal with at least one of an edge rise time or edge decay time of less than 10 ns.

12. The audio signal system as claimed in claim 8, wherein each of the multiplicity of connection sockets has at least two audio signal interfaces connected to the ground interface of the connection socket in each case via a series circuit comprising a resistor and a capacitor.

13. The audio signal system as claimed in claim 12, wherein resistance values of the resistors of the two series circuits of each of the multiplicity of connection sockets are different.

14. The audio signal system as claimed in claim 8, wherein the wired network has at least one signal splitter via which two or more of the multiplicity of connection sockets are connected to the signal processing device.

15. An aircraft comprising an audio signal system as claimed in claim 8.

16. The aircraft as claimed in claim 15, wherein each of the multiplicity of connection sockets has a first audio signal interface embodied as audio signal output and a second audio signal interface embodied as microphone input.

17. The aircraft as claimed in claim 15, wherein the electrical lines of the wired network have lengths of between 1 m and 200 m.

* * * * *